United States Patent [19]

Kobari et al.

[11] Patent Number: 4,882,529

[45] Date of Patent: Nov. 21, 1989

[54] PULSE ENCODER

[75] Inventors: Katsuo Kobari, Tachikawa; Yoshitaka Takekoshi, Hachioji; Mitsuyuki Taniguchi, Hino, all of Japan

[73] Assignee: Fanuc Ltd., Yamanashi, Japan

[21] Appl. No.: 238,211

[22] PCT Filed: Nov. 2, 1987

[86] PCT No.: PCT/JP87/00845

§ 371 Date: Jul. 6, 1988

§ 102(e) Date: Jul. 6, 1988

[87] PCT Pub. No.: WO88/03641

PCT Pub. Date: May 19, 1988

[30] Foreign Application Priority Data

Nov. 7, 1986 [JP] Japan .................................. 61-263966

[51] Int. Cl.$^4$ ............................................. G05B 19/28
[52] U.S. Cl. ..................................... 318/602; 328/120; 123/480; 364/431.11; 318/603; 340/679
[58] Field of Search ................. 318/311, 312, 314, 317, 318/326, 327, 329, 341, 563-564, 565, 599, 601-605, 650, 653, 654, 655, 660, 661; 123/414, 416, 417, 440, 479, 480, 492, 493, 494; 364/413.3, 431.06, 431.12, 431.11; 340/512, 516, 562, 568, 52 F, 692, 682, 502, 506, 518, 525, 595, 652, 679, 524; 307/9, 10 R, 219, 106, 123; 331/2, 49, 55, 56, DIG. 2; 361/181, 269, 582, 242, 243; 324/172; 73/116; 328/120

[56] References Cited

U.S. PATENT DOCUMENTS

| 4,278,924 | 7/1981 | Mawatari et al. ............... 318/603 X |
| 4,328,547 | 5/1982 | Barman et al. .................. 123/480 X |
| 4,374,361 | 2/1983 | Holden ............................. 328/120 |
| 4,376,914 | 3/1983 | Kimura ............................. 318/603 |
| 4,379,993 | 4/1983 | Holden ............................. 328/120 |
| 4,395,905 | 8/1983 | Fujimori et al. . |
| 4,430,647 | 2/1984 | Moller ............................... 340/679 |
| 4,446,437 | 5/1984 | Rinaldi ............................. 328/120 |
| 4,467,285 | 8/1984 | Rinaldi ............................. 328/120 X |
| 4,553,426 | 11/1985 | Capurka ............................. 73/116 |
| 4,628,269 | 12/1986 | Hunninghaus et al. ............. 328/120 |
| 4,661,778 | 4/1987 | Anderson ......................... 328/120 X |
| 4,718,395 | 1/1988 | Iwata ............................... 123/414 X |
| 4,748,567 | 5/1988 | Sumizawa et al. .............. 364/431.11 |

FOREIGN PATENT DOCUMENTS

| 2546481 | 10/1975 | Fed. Rep. of Germany . |
| 3142555 | 10/1981 | Fed. Rep. of Germany . |
| 52-50272 | 4/1977 | Japan . |
| 56-43827 | 4/1981 | Japan . |
| 57-73620 | 5/1982 | Japan . |
| 1556762 | 11/1979 | United Kingdom . |

Primary Examiner—William M. Shoop, Jr.
Assistant Examiner—Paul Ip
Attorney, Agent, or Firm—Armstrong, Nikaido, Marmelstein, Kubovcik & Murray

[57] ABSTRACT

A pulse encoder has a motor detecting portion (1) which detects a motion of an object whose position should be measured and which outputs a signal having information regarding the motion. A clock generator (3) outputs a clock pulse. The pulse encoder processes the information regarding the motion synchronized by the clock pulse. The pulse encoder includes a clock malfunction detecting portion (4) which receives the clock pulse and at least a part of the signal having information regarding the motion showing whether the object, whose position should be measured, has moved or not. The clock malfunction detecting portion outputs a clock malfunction signal when motion is detected by the part of the signal having information showing whether the object has moved or not, when the clock pulse is not output.

3 Claims, 4 Drawing Sheets

PULSE ENCODER

TECHNICAL FIELD

The present invention relates to a pulse encoder having a clock generator.

BACKGROUND ART

In servo systems for numerically controlling machine tools, a detection of an angle of rotation of a motor, i.e., a detection of an absolute value of a position of an object which is moved by the motor, is carried out by counting incremental outputs of an incremental type pulse encoder.

When counting the incremental outputs of a pulse encoder as mentioned above or when processing informations in the form of a signal, to improve a resolution of the detection of positions or to suppress noise, synchronization by a clock pulse is carried out.

Processing signal information, for example, counting signals, by using a clock pulse is usually carried out, in a numerical control (NC) apparatus by receiving and processing the incremental outputs from a pulse encoder. But, as for counting the incremental outputs of a pulse encoder, or processing signal information to improve a resolution of the detection of positions or to suppress noise, a processing using a clock pulse is sometimes carried out at the pulse encoder side, and for this purpose, the pulse encoders mentioned above are provided with a clock generator.

FIG. 1 shows a general outline of a construction of a pulse encoder having a clock generator, and having a function of carrying out information processing using a clock pulse. In FIG. 1, a motion detecting portion 1, detects a motion of a object whose position should be measured, and outputs a signal (D) having information regarding the motion. A clock generator 3 outputs a clock pulse (CLK). A clock-synchronizing information processing portion, 2 receives the signal having information regarding the motion and the clock pulse, and processes the information regarding the motion by synchronization with the clock pulse.

FIG. 2 shows an actual example of the pulse encoder having the construction shown in FIG. 1, in which a motion detecting portion 1 detects a motion of an object whose position should be measured, and outputs a pair of rectangular pulses $P_A$, $P_B$ consisting of an A-phase signal and a B-phase signal with a 90° difference therebetween as shown in FIG. 3. The clock-synchronizing information processing portion 2 in FIG. 1 corresponds to an absolute value counting portion 2' in FIG. 2. The absolute value counting portion 2' detects a phase difference between the rectangular pulses $P_A$, $P_B$, and counts +1 for a phase difference corresponding to a motion in the positive direction, and counts −1 for a phase difference corresponding to a motion in the negative direction, as shown in FIG. 3. The absolute value counting portion 2' is a synchronous counter type which carries out the counting as mentioned above by synchronization with the clock pulse.

If, however, in the pulse encoder having a construction as mentioned above, i.e., having a clock generator, a malfunction occurs in the clock generator 3, and a clock pulse is not output, the processing in the clock-synchronizing information processing portion 2 can not be carried out because a clock pulse is not input even when the object whose position should be measured moves. For example, in the construction of FIG. 2 as mentioned above, counting is not carried out even when the object moves, and therefore, the NC which receives the output of the absolute value counting portion 2' in the pulse encoder of FIG. 2 determines that the object has not moved because the count of the pulse encoder has not changed. When the information processing regarding the motion can not be carried out even when the object whose position should be measured moves, because the clock pulse is not output due to a malfunction in the clock generator 3, it is necessary to inform the NC of the malfunction immediately.

DISCLOSURE OF THE INVENTION

An object of the present invention is to provide a pulse encoder which carries out information processing by synchronization with a clock pulse, by which a malfunction is immediately detected when the object whose position should be measured moves in a condition wherein the clock pulse is not output due to a malfunction in the clock generator or the like.

A pulse encoder according to the present invention comprises a motion detecting portion which detects a motion of a object whose position should be measured, and which outputs a signal having information regarding the motion a clock generator outputs clock pulse a clock-synchronizing information processing portion receives the signal having information regarding the motion and the clock pulse, and processes the information regarding the motion synchronized with the clock pulse; A clock malfunction detecting portion receives the clock pulse and at least a part of the signal having information regarding the motion showing whether the object, whose position should be measured, has moved or not, and outputs a clock malfunction signal when motion is detected by the part showing whether the object whose position should be measured has moved or not, if the clock pulse is not output.

BRIEF DESCRIPTION OR THE DRAWING

BEST MODE FOR CARRYING OUT THE INVENTION

Figure 4:
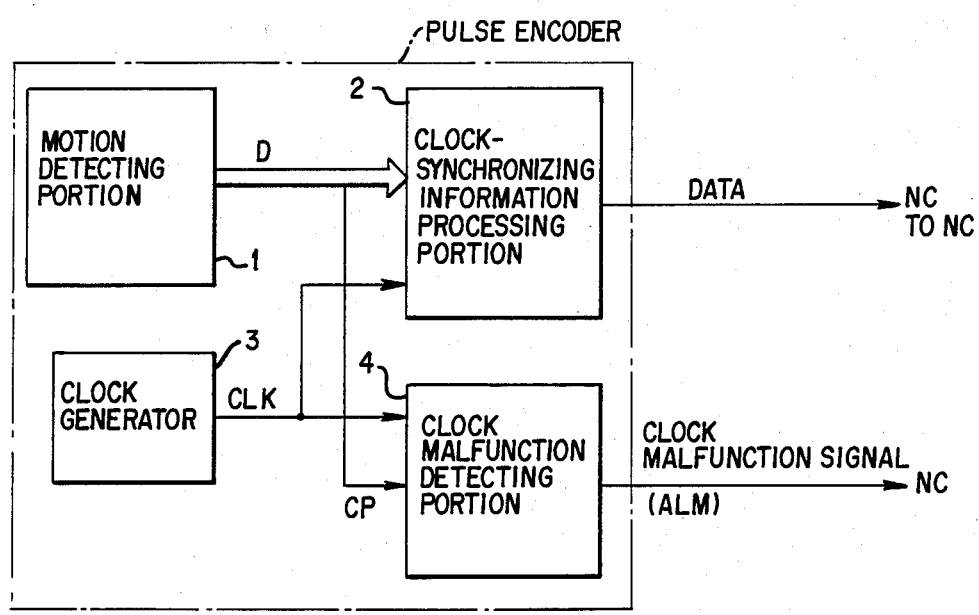
FIG. 4 shows the basic construction of a pulse encoder according to the present invention.

FIG. 4 shows a basic construction of the pulse encoder according to the present invention. In addition to the construction of the conventional pulse encoder, the pulse encoder of FIG. 4 has a clock malfunction detecting portion 4 which receives a clock pulse and at least a part of the signal having information regarding the motion showing whether the object, whose position should be measured, has moved or not, and outputs a clock malfunction signal when motion is detected by the part showing whether the object, whose position should be measured—has moved or not, if the clock pulse is not output.

Figure 1:
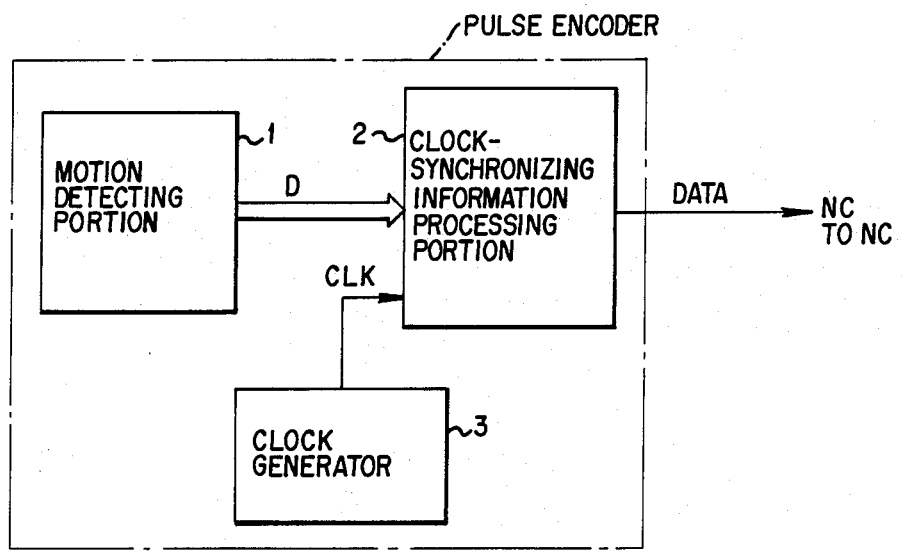
FIG. 1 shows a basic construction of a conventional pulse encoder.
Figure 2:
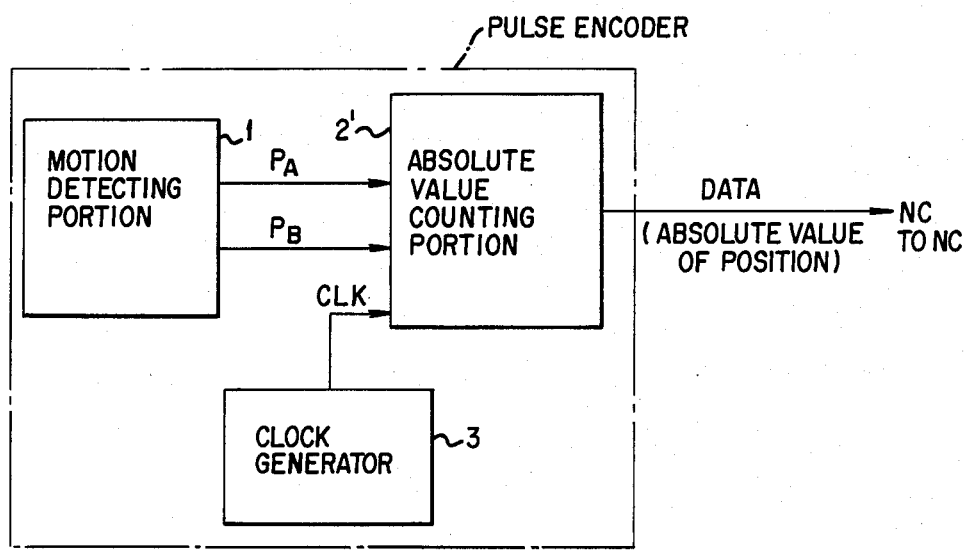
FIG. 2 shows an example of a construction of a conventional pulse encoder.
Figure 5:
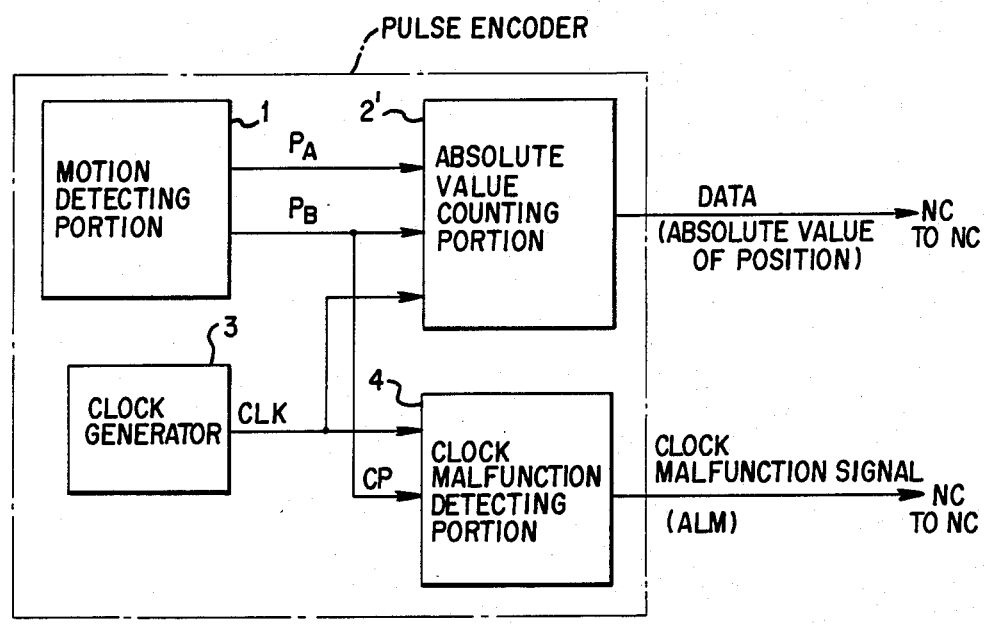
FIG. 5 shows a construction of an embodiment of a pulse encoder according to the present invention.

FIG. 5 shows the construction of a pulse encoder when the clock-synchronizing information processing portion 2 in FIG. 4 is the absolute value counting portion 2' as shown in the construction in FIG. 2.

Figure 3:
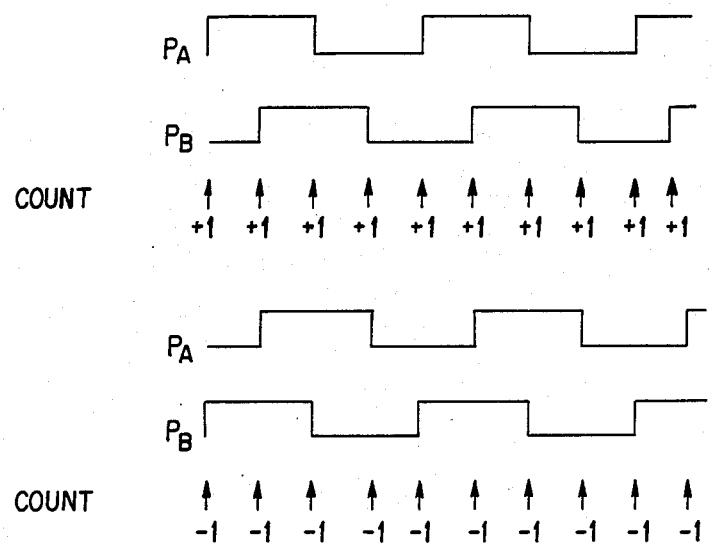
FIG. 3 shows the wave forms of the signals $P_A$, $P_B$ shown in FIG. 2, and the counting timing.

As "a part of the signal having information regarding to the motion showing whether the object whose position should be measured has moved or not," (hereinafter known as "a monitoring signal (CP)") in FIG. 4, the $P_B$ (FIG. 3) between the two outputs of the motion detecting portion 1 is used in FIG. 5; or the $P_A$, or the exclusive OR of the $P_A$ and $P_B$, can be used. In the latter case, the exclusive OR of the $P_A$ and $P_B$ has a cycle time which is a half of the cycle time of $P_A$ or $P_B$, which results in a faster response speed, as explained later. Alternatively, where the pulse encoder outputs a special signal (hereinafter called "a Z-phase signal") each time a rotating slit disc makes one rotation, the Z-phase signal can be used as a monitoring signal CP mentioned above, Similar to the basic construction in FIG. 4, the clock pulse (CLK) from the clock generator 3 is input to the clock malfunction detecting portion 4.

Figure 6:
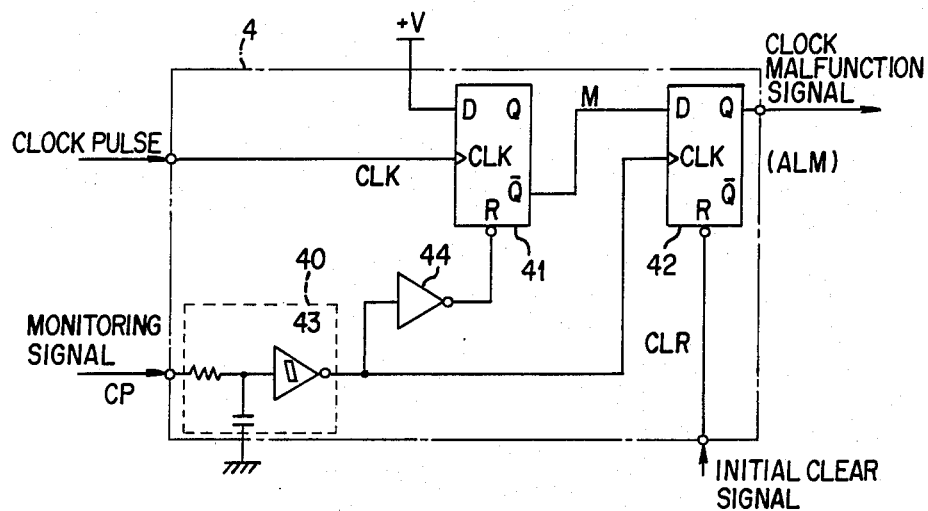
FIG. 6 shows a construction of a clock malfunction detecting portion provided according to the present invention.

FIG. 6 shows an example of the construction of the clock malfunction detecting portion 4 in FIG. 5. In FIG. 6, a first D-type flip-flop is labeled 41, a second D-type flip-flop is labeled 42, a Schmitt trigger circuit is labeled 43, and an inverter is labeled 44.

The clock pulse is applied to a CLK input terminal in the first D-type flip-flop 41. The monitoring signal (CP) passes through a waveform shaping portion 40 which consists of a resistor, a condenser, and the Schmitt trigger circuit 43, passes through the inverter 44, and then is input to an inverted reset input terminal (R) of the first D-type flip-flop 41. The output of the waveform shaping portion 40 is also input to a CLK input terminal in the second D-type flip-flop 42. A D input of the first D-type flip-flop 41 is maintained at "H" level (+V), a $\overline{Q}$ output of the first D-type flip-flop 41 is connected to a D input of the second D-type flip-flop 42, and an initial clear signal (CLR) is input to an inverted reset input terminal (R) of the second D-type flip-flop 42.

Figure 7:
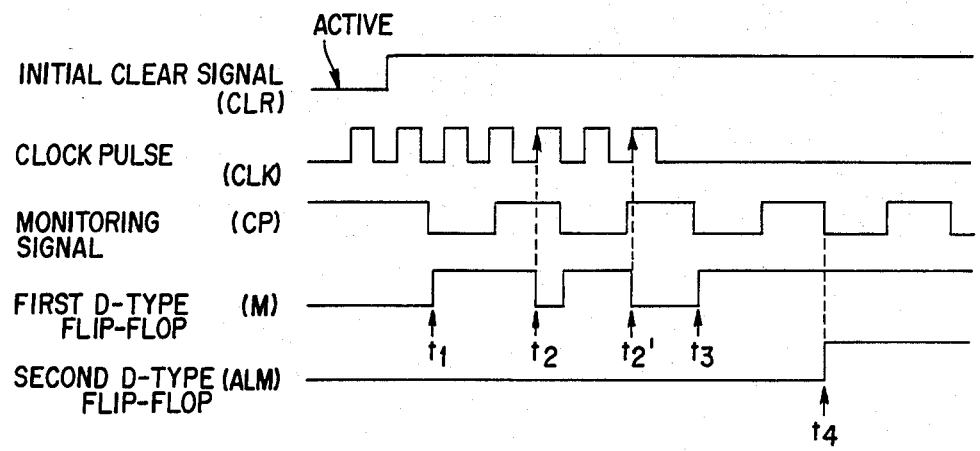
FIG. 7 shows the wave forms of the signals showing an operation of the clock malfunction detecting portion in FIG. 6.

The operation of the circuit of FIG. 6 is shown in FIG. 7. First an "L" level initial clear signal (CLR) is input to an inverted reset input terminal (R) of the first D-type flip-flop 42, and the Q output of the second D-type flip-flop 42 becomes "L" level. In a normal condition, the clock pulse is constantly input. The phase of the monitoring signal (CP) proceeds according to the motion of the object whose position should be measured, and the monitoring signal (CP) changes from "L" level to "H" level, or from "H" level to "L" level each time the phase of the signal go through 180°.

If the monitoring signal (CP) changes from "H" level to "L" level, this signal is inverted twice, i.e., at the Schmitt trigger circuit 43 and at the inverter 44, and is then input to the inverted reset input terminal (R) of the first D-type flip-flop 41. Therefore, the first D-type flip-flop 41 is reset and the $\overline{Q}$ output (shown by "M" in FIG. 6 and FIG. 7) becomes "H" level ($t_1$ in FIG. 7).

As the D input of the first D-type flip-flop 41 is maintained at "H" level, when the phase of the monitoring signal for (CP) proceeds, then the state of the monitoring signal (CP) is changed and the reset of the first D-type flip-flop 41 is released. If a leading edge of the following clock pulse is input to the CLK input terminal of the first D-type flip-flop 41, after the reset of the first D-type flip-flop 41 is released, the $\overline{Q}$ output, i.e., "M", returns to the "L" level ($t_2$, $t_2'$ in FIG. 7).

But, when the clock pulse is not input, after the "M" becomes "H" level ($t_3$ in FIG. 7) according to the fall of the monitoring signal (CP) due to the motion of the object whose position should be measured, the "M" is maintained at "H" level because a clock signal is not input, i.e., the D input of the second D-type flip-flop 42 is maintained at "H" level. In this condition, because the inverted signal of the monitoring signal (CP) is input to the second D-type flip-flop 42, when the monitoring signal (CP) falls to "L" level, the Q output of the second D-type flip-flop 42 becomes "H" level, i.e., the clock malfunction signal (ALM) is output ($t_4$ in FIG. 7).

If the exclusive OR of the signals $P_A$ and $P_B$ instead of the signal $P_B$ selected in FIG. 5 is selected as a monitoring signal (CP), the cycle time of the monitoring signal (CP) becomes half of the cycle time of the signal $P_B$, and therefore, the interval between $t_3$ and $t_4$ in FIG. 7 becomes a half of the interval when the signal $P_B$ is used as monitoring signal (CP), i.e., the response of the circuit becomes faster.

We claim:

1. A pulse encoder comprising:
   a motion detecting portion which detects a motion of an object whose position should be measured, and which outputs a signal having information regarding the motion;
   a clock generator which outputs a clock pulse;
   a clock-synchronizing information processing portion which receives the signal having information regarding the motion and the clock pulse, and processes the information regarding the motion synchronized by the clock pulse; and
   a clock malfunction detecting portion which receives the clock pulse and at least a part of the signal having information regarding the motion, said part of the signal having information showing whether or not the object, whose position should be measured, has moved or not, and said clock malfunction detecting portion outputs a clock malfunction signal when motion is detected by the part of the signal while the clock pulse is not output.

2. A pulse encoder according to claim 1, in which said signal having information regarding the motion includes a signal whose state is changed at each movement of a predetermined distance;
   said clock malfunction detecting portion consists of a first D-type flip-flop which is set in one state between two stable states when one of a leading edge or a tailing edge of the clock pulse is input, and is set in the other state between the two stable states when one of a leading edge or a tailing edge of said signal which changes state for each movement of a predetermined distance; and a second D-type flip-flop which receives a output of the first D-type flip-flop and the signal whose state is changed at each motion of a predetermined distance, and outputs a clock malfunction signal when receiving one of the leading edge or the tailing edge of said signal whose state is changed at each motion of a predetermined distance in a condition while said first D-type flip-flop is set in the other state between said two stable states.

3. A pulse encoder comprising:
   a motion detecting portion detects a motion of an object a position of which should be measured, and which outputs a signal having information regarding the motion;
a clock generator outputs a clock pulse;
a clock-synchronizing information processing portion receives said signal having information regarding the motion and said clock pulse, and processes the information regarding the motion synchronized by the clock pulse;
a clock malfunction detecting portion for receiving said clock pulse and at least a part of said signal having information regarding the motion, said part of the signal having information showing whether or not the object has moved, and said clock malfunction detecting portion outputs a clock malfunction signal, when motion is detected by said part of the signal having information showing whether or not the object the position of which should be measured has moved, while the clock pulse is not output; wherein
said signal having information regarding the motion, includes a signal whose state is changed corresponding to each movement of a predetermined distance; and
said clock malfunction detecting portion having,
a first D-type flip-flop which is set in one state between two stable states when one of a leading edge or a trailing edge of said clock pulse is input, and is set in the other state between said two stable states when one of a leading edge or trailing edge of said signal which changes state corresponding to each movement of the predetermined distance; and
a second D-type flip-flop which receives an output of said first D-type flip-flop and said signal whose state is change corresponding to each motion of the predetermined distance, and outputs a clock malfunction signal when receiving one of the leading edges or the trailing edges of said signal whose state is changed corresponding to each motion of the predetermined distance while said first D-type flip-flop is set in the other state between said two stable states.

* * * * *